(12) United States Patent
Bias

(10) Patent No.: US 6,218,611 B1
(45) Date of Patent: Apr. 17, 2001

(54) SELF LOCKING RADIO FREQUENCY PLUG

(75) Inventor: Eugene Edward Bias, Franklin, OH (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/326,109

(22) Filed: Jun. 4, 1999

(51) Int. Cl.[7] .................................................. H05K 11/06
(52) U.S. Cl. .............................. 174/35 GC; 174/35 R; 220/787
(58) Field of Search ................... 174/35 SM, 35 R, 174/35 GC; 361/816, 818, 800; 220/787, 790, 315

(56) References Cited

U.S. PATENT DOCUMENTS

| | | | |
|---|---|---|---|
| Re. 30,326 | * 7/1980 | van Buren, Jr. ..................... 220/326 |
| 4,179,038 | * 12/1979 | Rosan, Jr. ............................ 220/243 |
| 4,384,165 | * 5/1983 | Loving, Jr. et al. ............. 174/35 GC |
| 4,620,641 | * 11/1986 | Beer ..................................... 220/288 |
| 4,832,234 | * 5/1989 | Peterson ............................... 220/306 |

* cited by examiner

Primary Examiner—Dean A. Reichard
Assistant Examiner—Carmelo Oliva
(74) Attorney, Agent, or Firm—Jack R. Penrod

(57) ABSTRACT

A radio frequency cover and complementary shaped hole that securely fit together to provide electro magnetic and electrostatic shielding of adjustment access holes. The cover preferably is cold headed and the complementary hole is either stamped, machined or cast for inexpensive mass production. Each cover preferably has a socket or slit on its top surface to receive and be guided by a tool, which also secures the cover in an access hole within a second access hole in radio frequency and/or electronic systems. The covers include self tapping thread formers to further reduce manufacturing time and costs.

23 Claims, 4 Drawing Sheets

SELF LOCKING RADIO FREQUENCY PLUG

FIELD OF INVENTION

The invention relates generally to radio frequency (rf) plugs that are inserted into access holes in walls, covers and chassis of radio frequency electrical or electronic equipment to prevent each access hole from acting as an antenna and radiating rf energy to nearby equipment, and more specifically to rf plugs that fit flush, seal in rf energy and are easily installed.

BACKGROUND OF INVENTION

The need for access holes in the walls, covers and chassis of enclosed electronic equipment is well known. These holes allow access for adjusting and/or testing internal components of an assembly while enclosed in radio frequency shielding. Once the adjusting and/or testing is completed, the access holes must be covered or plugged. That is because discontinuities, such as access holes, act as antennae for the electromagnetic fields from the electrical circuitry adjusted or tested by means of such holes, According to well known electromagnetic field theory, the amount and frequency of the electromagnetic energy that is spuriosly emitted depends upon the frequency and power level of the enclosed electrical circuitry. The enclosed circuitry may be for digital logic, computers, radios or telephone equipment. All of these use radio frequency signals that can become spurious emissions if not appropriately contained.

The known cover 100 for access holes, as seen in FIG. 1, has a domed or button shaped body 102 and has curved, springy appendages 104 coming out from the bottom circumference of the body. These appendages 104 are crafted such that when the right sized cover 100 is placed over a hole (not shown) and pressed in, the appendages 104 are initially forced inward by the sides of the hole and then as the bottom of the button nears the surface in which the hole is located their springiness and their shapes allow the appendages to expand outward. Also, because of the shape of the appendages 104, this expanding action against the edges of the hole actually draws the cover 100 down toward the surface and locks it in place. To be effective, the known cover 100 must be bigger than the hole it is in—otherwise the spring action would pull the body portion 102 into the hole. This size difference between the cover 100 and the hole it goes into prevents covering a hole inside of another a hole unless the holes and their respective covers are made progressively and substantially larger towards the outside of the enclosure. Covers within covers are also hard to install. Furthermore, the appendages must be shaped for a range of hole depths and material thicknesses. If the hole is too deep, the pulling action and the locking do not occur. If the hole is very shallow, the pulling action and the locking will not occur either and the cover 100 will be loose and less effective. Furthermore, the appendages 104 as they extend into the enclosure can and will begin to act as antennas for emissions within the enclosure if the effective size of the appendages 104 is approximately a quarter wavelength. This often leads to unintended coupling of circuits when a cover 100 is installed.

Thus, it is an object of the present invention to provide a cover or plug that mounts flush with the top and bottom surfaces of the hole it is inserted into.

It is another object of the invention to provide a cover or plug that can be readily passed through a first hole to cover an interior access/test hole.

It is a further object of the present invention to provide a locking on almost any thickness of material.

SUMMARY OF INVENTION

Briefly stated in accordance with one aspect of the invention, the aforementioned problems are addressed by providing an apparatus for enclosing an electrical circuit. The apparatus includes a conductive enclosure that has an interior surface and an exterior surface. This conductive enclosure has a hole formed therein. The hole is defined in a first portion by a first cylindrical surface that has a first radius. This first cylindrical surface is connected at a first end thereof to the interior surface of the enclosure. The hole also being defined in a second portion by a second cylindrical surface that has a second radius. This second cylindrical surface has multiple semi-cylindrical voids spaced equally around its perimeter. Each of the radii of the semi-cylindrical voids is smaller than the smaller of the first and second radii of the first and second cylinders. The second cylindrical surface is connected at a first end thereof to the exterior surface of the enclosure and extends such that a second end of the second cylindrical surface is coplanar with the second end of the first cylindrical surface;. Also defining the hole is a ring shaped surface that is located between the second ends of the first and second cylinders and located in the common plane of those second ends. A cover is adapted to fit in the hole and engage the surfaces of the conductive enclosure sufficiently to prevent emission of electrical and electromagnetic fields through the hole.

In accordance with another aspect of the invention, the aforementioned problems are addressed by providing an apparatus for enclosing an electric circuit includes a conductive enclosure that has an interior surface and an exterior surface. This conductive enclosure has a hole formed therein. The hole is defined in a first portion by a first cylindrical surface that has a first radius. This first cylindrical surface is connected at a first end thereof to the interior surface of the enclosure. The hole also being defined in a second portion by a second cylindrical surface that has a second radius. This second cylindrical surface has multiple semi-cylindrical voids spaced equally around its perimeter. Each of the radii of the semi-cylindrical voids is smaller than the smaller of the first and second radii of the first and second cylindrical surfaces. The second cylindrical surface is connected at a first end thereof to the exterior surface of the enclosure and extends such that a second end of the second cylindrical surface is coplanar with the second end of the first cylindrical surface. Also defining the hole is a ring shaped surface that is located between the second ends of the first and second cylindrical surfaces and located in the common plane of those second ends. A cover is adapted to fit in the hole and engage the surfaces of the conductive enclosure sufficiently to prevent emission of electrical and electromagnetic fields through the hole. The cover has a first cylindrical portion to fit in said first cylindrical portion of the hole and a second cylindrical portion to fit within the second portion of the hole. The second cylindrical portion of the cover has multiple protrusions adapted to fit into the multiple semi-circular voids. Additionally, the cover has a recess therein for receiving a tool to rotate the cover into sufficient engagement with the surfaces of the enclosure in order to hold the cover in place.

DETAILED DESCRIPTION

Figure 1:
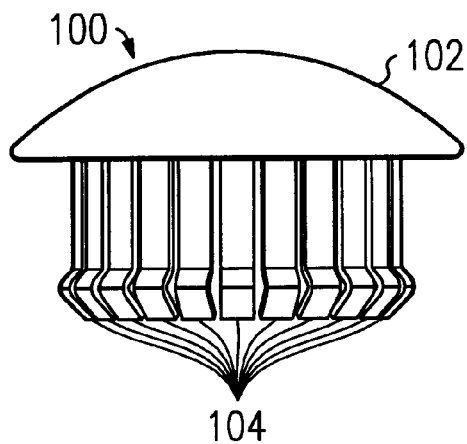
FIG. 1 is a side view of a prior art cover.
Figure 2:
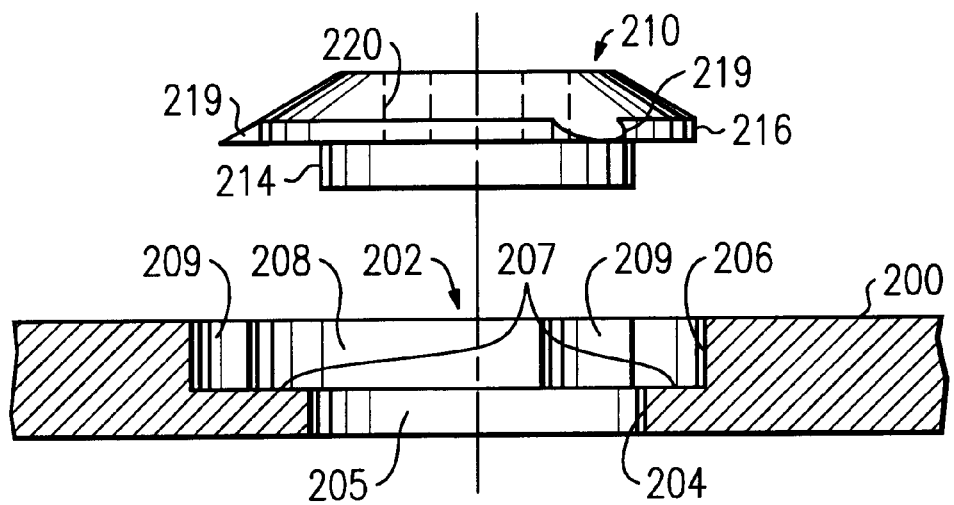
FIG. 2 is partially cut away exploded view of an enclosure and a cover according to the present invention and the access hole that the cover it fits into.

Referring now to FIG. 2, an enclosure 200 is shown for enclosing electronic circuitry (not shown) and the inherent electromagnetic fields (not shown) that attend the presence of electronic circuitry. An example of a hole or void 202 is formed in enclosure 200. The purpose of hole 202 is to provide access for adjustment to variable components, such as variable resistors, potentiometers, variable inductors, variable capacitors, switches, etc. (not shown), located within the enclosure 200. After any and all adjustments have been made, hole 202 is covered with a cover 210. Cover 210 when installed in hole 202 acts electro-magnetically and electrostatically as part of enclosure 200 to shield the enclosed electronic circuits from electromagnetic fields and electric fields from outside of the enclosure 200. In a like manner, cover 210 when installed in hole 202 also acts as part of the enclosure 200 to keep electromagnetic fields and electric fields that are located within the enclosure 200 from escaping from the enclosure 200 by covering the hole 202. The cover 210 when inserted into its receiving hole 202 makes the enclosure appear electro-magnetically and electrostatically continuous, just as if the hole 202 was not there.

Figure 3:
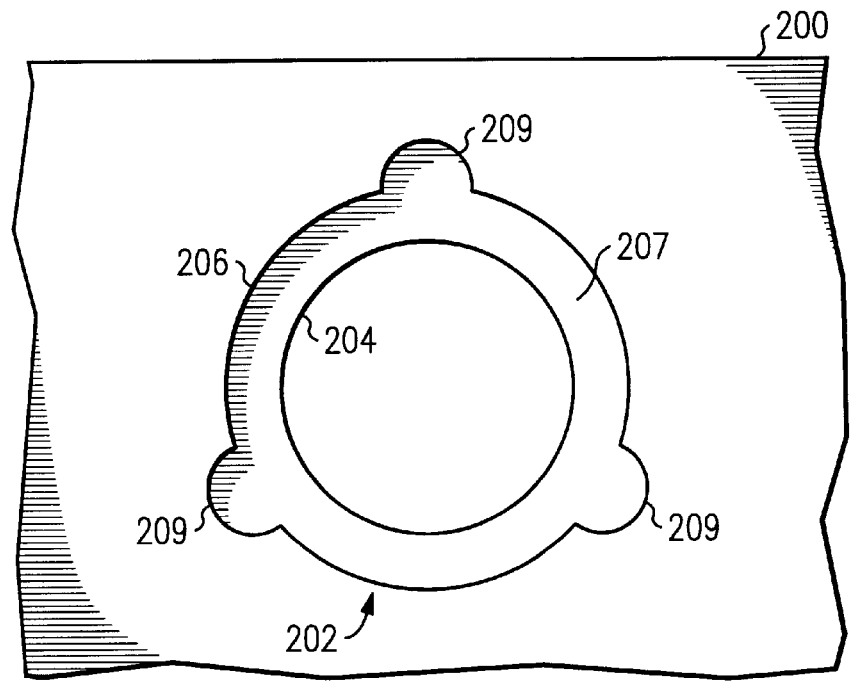
FIG. 3 is an elevational view of a partially cut away enclosure with a hole therein to receive a cover according to the invention.

The hole 202 has a special shape for receiving the cover 210. Each hole 202 has a circular lower portion 204 defined by cylindrical surface 205 and a mainly circular upper portion 206. The lower portion 204 is smaller in diameter than the mostly circular upper portion 206. This relationship causes a surface 207 that is recessed from the surface of the rest of the outer surface of enclosure 200 and generally parallel thereto. The mainly circular upper portion is defined by surface 207 and generally cylindrical surface 208. Generally cylindrical surface 208 would be cylindrical but for three approximately semicircular cutouts 209. This recessed surface 207 and the cutouts 209 are better seen in FIG. 3. The enclosure 200 is typically a soft, electrical conducting material such as aluminum or brass. Since the material of enclosure 200 is relatively soft, one or more holes 202 may be formed by casting, stamping or drilling and milling procedures.

Each hole 202 is defined by two cylindrical surfaces 205, 206 that are located one adjoining the other. In one embodiment of the invention, the two surfaces 205 and 206 and the two hole portions they define are co-axial, i.e. located along a common axis. In a second embodiment, the mainly circular surface 206 decreases in radius in the direction that the cover 210 is to be rotated for installation. Thus, for one example for a clockwise rotation, a radius of surface 206 changes from 0.150 inches immediately clockwise from one semicircular cutout 209, to a radius of 0.148 inches approximately half way to the next semicircular cutout 209 in the clockwise direction and to a radius of 0.145 inches immediately before the next cutout 209 in the clockwise direction. This slight reduction in the radius of the mainly circular surface 206 increases the interference fit between a cover 210 and a surface 206 in the direction that the cover 210 is to be rotated in order to secure it tightly, which in turn helps keep the cover 210 fitting tightly in hole 202 after numerous insertions and removals. Those in the art will recognize that if the cover was to be secured by rotating it in the counterclockwise direction, then the increase in the interference fit would be in the counterclockwise direction.

Figure 4:
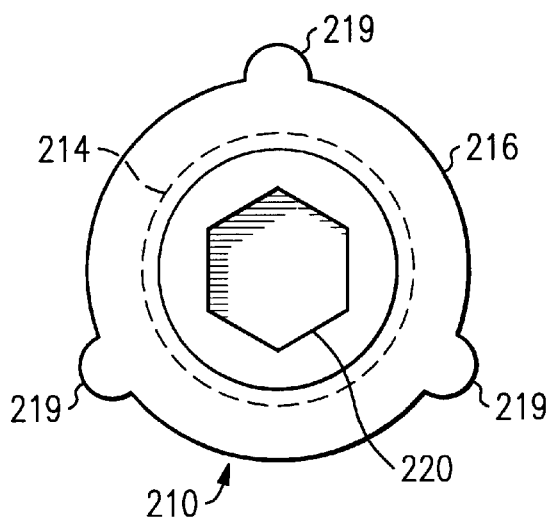
FIG. 4 is an elevational view of a cover.
Figure 5:
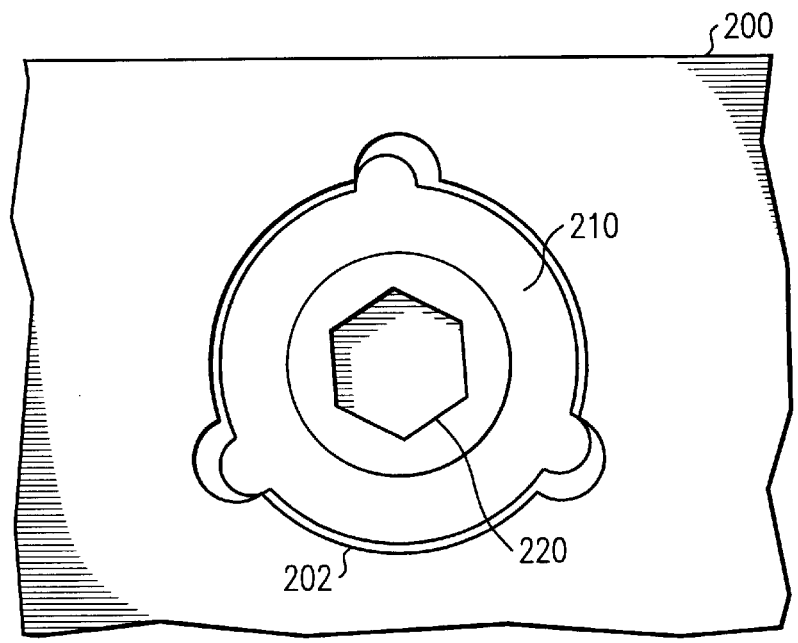
FIG. 5 is an elevational view of a cover and a partially cut away enclosure according to the present invention.
Figure 6:
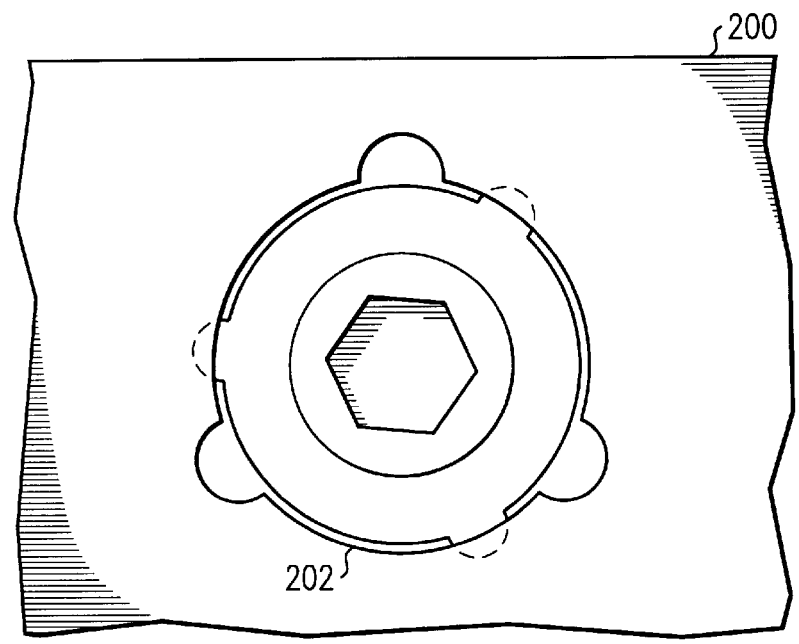
FIG. 6 is an elevational view of FIG. 5, except the cover has been rotated within the hole.

Referring now to FIGS. 2 and 4, one embodiment of the cover 210 will be described. The cover 210 is adapted to fit in the hole 202. Cover 210 has a first cylindrical portion 214 and a second generally cylindrical portion 216. Since hole 202 has three cutouts or voids, 209, the second cylindrical portion 216 has three protrusions 219 that are matched in size and spaced relationship with cutouts 209. In the top of the cover 210, a recess 220 is formed. Recess 220 is provided so the cover can be inserted onto the end of a tool shaft, placed in a hole 202 and then rotated up to approximately 30 degrees by means of that tool (not shown). The recess 220 may be adapted to receive different tools. In FIGS. 1–5 a hexagonal recess to accept an alien wrench is shown. In FIG. 6, a recess for use with a torx wrench is shown. Recesses that accept standard screwdrivers and cross-indexed screwdrivers are also contemplated but not shown. For ease of use, cover 210 may be made of a magnetic material, such as steel. If cover 210 is made of magnetic material, then a magnetized tool will help keep a cover 210 on the tool until the cover is properly positioned in hole 202 and locked in place by rotating the cover in the hole 202. Also, if two different level of enclosures are used, successively larger covers can be inserted on the various level of enclosure to seal access holes to more than one level of enclosure without the covers falling off the tool.

Recess 220 also allows the user of the cover to rotate the cover 210 approximately 30 degrees while it is in hole 202. This rotation of a hard cover 210 in a hole 202 surrounded by a relatively soft material causes zero helix partial threads to be formed by the protrusions 219 in the surface 206. This forming rotation leads to a high amount of friction between protrusions 219 and the surface 206 that locks the cover 210 in place. The protrusions 219 typically will compress the sides of the threads in surface 206 in their immediate vicinity leading to elastic recovery in the threads the protrusions 219 turned through. This elastic recovery of the threads behind the protrusions 219 aid the locking action. The cover 210 remains in place until it is removed for access or adjustment or both. FIG. 6 shows a cover 210 locked in place.

Figure 7:
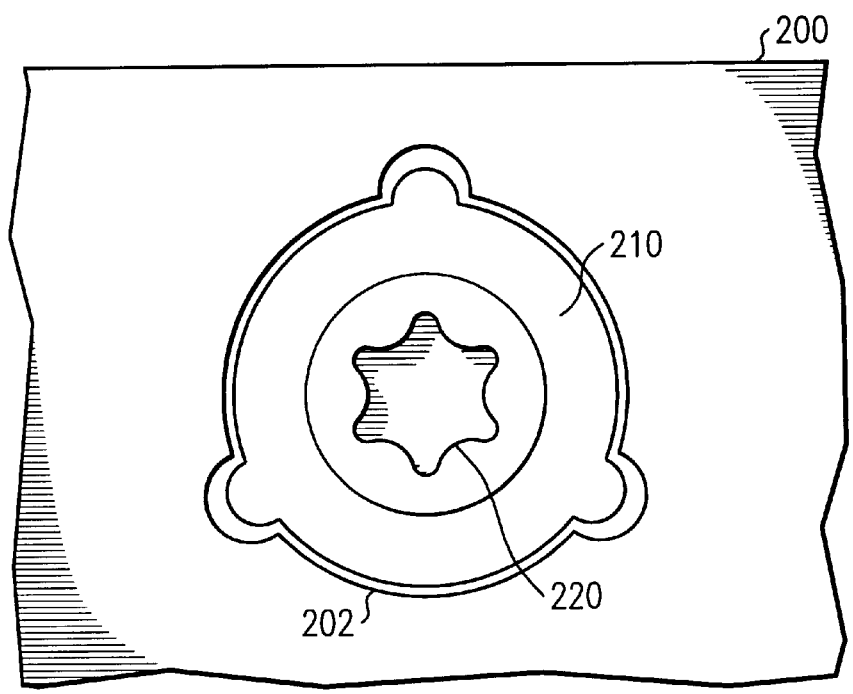
FIG. 7 is an elevational view of a cover and a partially cut away enclosure according to another embodiment of the present invention.

FIG. 7 shows an embodiment of the invention wherein the recess is formed to receive a torx head tool instead of the hexagonal socket shown in FIG. 6. Because of torque characteristics, the torx head embodiment is considered to be the preferred embodiment.

Thus, it will now be understood that there has been described an apparatus for providing an enclosure with a sealable covers for adjustment holes. While the invention has been particularly illustrated and described with reference to preferred embodiments thereof, it will be understood by those skilled in the art that various changes in form, details, and applications may be made therein. For example, the cutouts may be other shapes other than semicircular as long as the protrusions can fit therein in order to form the securing threads. It is accordingly intended that the appended claims shall cover all such changes in form, details and applications which do not depart from the true spirit and scope of the invention.

What is claimed as new is:

1. An apparatus for enclosing an electrical circuit comprising:

a conductive enclosure having an interior surface and an exterior surface;

said conductive enclosure having a hole therein;

said hole being defined in a first part by a cylindrical surface of a first radius;

said cylindrical surface being connected at a first end thereof to said interior surface, said hole also being defined in a second part by a mainly circular surface of a second radius;

said mainly circular surface having a plurality of semi-cylindrical voids spaced equally around its circumference, each of the radii of the semi-cylindrical voids is smaller than the smaller of said radius of said cylindrical surface and said mainly circular surface;

said mainly circular surface being connected at a first end thereof to said exterior surface of said enclosure and extends such that a second end of said mainly circular surface is located in a common plane with a second end of said cylindrical surface; also defining said hole is a ring shaped surface that is located between said second ends of said cylindrical surface and said mainly circular surface in the common plane thereof;

a conductive cover adapted to fit in said hole; and wherein said conductive cover is adapted to engage said cylindrical and mainly circular surfaces of said conductive enclosure sufficiently upon rotating said conductive cover in said hole to prevent emission of electrical and electro-magnetic fields through said hole.

2. The apparatus of claim 1, wherein said cover has a recess therein for receiving a tool to rotate said cover into sufficient engagement with said cylindrical and mainly circular surfaces of said enclosure to hold the cover in place.

3. The apparatus of claim 2, wherein said recess is a hexagonal socket.

4. The apparatus of claim 2, wherein said recess is a torx socket.

5. The apparatus of claim 2, wherein said recess is a slot for a cross indexed screwdriver.

6. The apparatus of claim 2, wherein said recess is a slot for a standard screwdriver.

7. The apparatus of claim 1, wherein said cover has a plurality of equally spaced semi-circular protrusions each having a semi-circular edge that is adapted to engage a surface of said semi-cylindrical voids.

8. The apparatus of claim 7, wherein each said engagement of each semi-circular protrusion with each respective semi-cylindrical void is an interference fit.

9. The apparatus of claim 7, wherein each said engagement of each semi-circular protrusion with each respective semi-cylindrical void forms a partial thread and each semi-circular protrusion engages said partial thread.

10. An apparatus for enclosing an electrical circuit comprising:

a conductive enclosure having an interior surface and an exterior surface;

said conductive enclosure having a hole therein;

said hole being defined in a first part by a cylindrical surface of a first radius;

said cylindrical surface being connected at a first end thereof to said interior surface, said hole also being defined in a second part by a mainly circular surface having another radius;

said mainly circular surface having a plurality of voids spaced equally around its circumference, each of the diameters of the voids is smaller than the smaller of said cylindrical surface radius and said mainly circular surface radius;

said mainly circular surface being connected at a first end thereof to said exterior surface of said enclosure and extends such that a second end of said mainly circular surface is located in a common plane with said second end of said cylindrical surface; also defining said hole is a ring shaped surface that is located between said second end of said mainly circular surface and said second end of said cylindrical surface in the common plane thereof; and a cover adapted to fit in said hole and engage said surfaces of said conductive enclosure sufficiently to prevent emission of electrical and electro-magnetic fields through said hole;

said cover having a cylindrical portion to fit in said cylindrical surface of said hole and a mainly circular portion to fit within said mainly circular surface of said hole;

said mainly circular portion having a plurality of protrusions adapted to fit into said plurality of voids; and said cover has a recess therein for receiving a tool to rotate said cover into sufficient engagement with said cylindrical and mainly circular surfaces of said enclosure to hold the cover in place.

11. The apparatus of claim 10 wherein placing said cover in said hole and rotating said cover locks said cover into place.

12. The apparatus of claim 11, wherein said cover is rotated 30 degrees to lock said cover into place.

13. The apparatus of claim 12, wherein said enclosure is made out of a soft metal and said cover is made out of a harder metal, and rotating said cover 30 degrees forms a plurality of zero helix partial threads in said enclosure.

14. The apparatus of claim 12, wherein said cover is rotated back 30 degrees to unlock and remove the cover to adjust said electrical circuit within said enclosure.

15. The apparatus of claim 10 wherein said mainly circular portion of said cover is adapted to be flush with said exterior surface of said enclosure when engaged.

16. The apparatus of claim 15, wherein said cylindrical portion of said cover is adapted to be flush with said interior surface of said enclosure when engaged.

17. The apparatus of claim 13, wherein said cylindrical portion of said cover is adapted to be flush with said interior surface of said enclosure when engaged.

18. The apparatus of claim 13 wherein said enclosure is cast with said hole therein.

19. The apparatus of claim 13 wherein said enclosure is stamped to form said hole therein.

20. The apparatus of claim 13 wherein said enclosure is machined to form said hole therein.

21. The apparatus of claim 10, wherein said enclosure with said cover engaged prevents electric and electro-magnetic fields of the enclosed electrical circuit from escaping through said hole.

22. The apparatus of claim 21 wherein said electrical circuit includes radio frequency carrying components.

23. The apparatus of claim 10 wherein said plurality of voids is equal in number to three.

* * * * *